(12) United States Patent
Vernon et al.

(10) Patent No.: US 6,451,176 B1
(45) Date of Patent: Sep. 17, 2002

(54) ELECTROSTATIC PARTICLE TRAP FOR ION BEAM SPUTTER DEPOSITION

(75) Inventors: Stephen P. Vernon, Pleasanton; Scott C. Burkhart, Livermore, both of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/705,980

(22) Filed: Nov. 3, 2000

(51) Int. Cl.[7] ............................................. C23C 14/46
(52) U.S. Cl. ............................ 204/192.11; 204/298.04; 204/298.06
(58) Field of Search ..................... 204/192.11, 298.04, 204/298.05, 298.06

(56) References Cited

U.S. PATENT DOCUMENTS

| | | | | |
|---|---|---|---|---|
| 3,562,142 A | * | 2/1971 | Lamont, Jr. | 204/298.06 |
| 3,864,239 A | * | 2/1975 | Fletcher et al. | 204/298.06 |
| 4,664,938 A | * | 5/1987 | Walker | 118/723 R |
| 4,727,000 A | * | 2/1988 | Ovshinsky et al. | 428/635 |

FOREIGN PATENT DOCUMENTS

JP 5-132395 * 5/1993 ............ 204/192.11

* cited by examiner

Primary Examiner—Rodney G. McDonald
(74) Attorney, Agent, or Firm—L. E. Carnahan; Alan H. Thompson

(57) ABSTRACT

A method and apparatus for the interception and trapping of or reflection of charged particulate matter generated in ion beam sputter deposition. The apparatus involves an electrostatic particle trap which generates electrostatic fields in the vicinity of the substrate on which target material is being deposited. The electrostatic particle trap consists of an array of electrode surfaces, each maintained at an electrostatic potential, and with their surfaces parallel or perpendicular to the surface of the substrate. The method involves interception and trapping of or reflection of charged particles achieved by generating electrostatic fields in the vicinity of the substrate, and configuring the fields to force the charged particulate material away from the substrate. The electrostatic charged particle trap enables prevention of charged particles from being deposited on the substrate thereby enabling the deposition of extremely low defect density films, such as required for reflective masks of an extreme ultraviolet lithography (EUVL) system.

23 Claims, 1 Drawing Sheet

ELECTROSTATIC PARTICLE TRAP FOR ION BEAM SPUTTER DEPOSITION

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to ion beam sputter deposition, particularly to the reduction of defects in ion beam sputtered coatings, and more particularly to a method and apparatus for the interception and trapping of particulate matter generated in ion beam sputter deposition for producing low defect coatings.

Defect free films and coatings are desired for many applications, particularly in the field of optics. Substantial effort has been directed to preventing the formation of defects and to the removal of defects resulting from a deposition process. For example, multilayer (ML) coatings for extreme ultraviolet lithography (EUVL) reflective masks must be defect free. Currently, there is no viable mechanism for repairing ML coating defects. Consequently, development of low defect coating technology is a critical problem for EUVL. To date, the lowest defect density of EUVL ML films are fabricated using an ion beam sputter deposition (IBSD) process that utilizes a radio frequency (RF) ion beam source or gun and extraction optics to sequentially sputter Mo and Si targets, for example, with a neutralized argon (Ar+) ion beam. Unwanted particulate material within the IBSD system can acquire an electrical charge due to a combination of electron attachment and ion bombardment as it is transported through the IBSD system. Thus, there has been a need for removing the charged particles before they deposit on a substrate being coated, thereby reducing defects in the deposited material.

The present invention provides a solution to this charged particle problem by providing an electrostatic trap for such charged particles. The invention involves a method and apparatus for the interception and trapping of charged particulate matter generated in ion beam sputter deposition. The interception and trapping of the charged particles is achieved by generating an electrostatic field, by an array of electrodes (1 through n) in the vicinity of the substrate on which a coating is being deposited, and configuring the fields to force the particulate material away from the substrate, thereby producing low density defect coatings.

SUMMARY OF THE INVENTION

It is an object of the present invention to produce low defect ion beam sputtered coatings.

A further object of the invention is to provide a method and apparatus for preventing undesired particulate matter generated during ion beam sputter deposition from reaching the substrate being coated.

A further object of the invention is to provide an electrostatic particle trap for use in ion beam sputter deposition systems.

Another object of the invention is to provide an electrostatic particle trap for charged particles generated during ion beam sputter deposition.

Another object of the present invention is to provide a method for the interception and trapping of charged particles by generating electrostatic fields in the vicinity of a substrate being coated, and configuring the fields to force the charged particles away from the substrate.

Another object of the invention is to provide an electrostatic particle trap for charged particles composed of an array of electrodes (1 through n) positioned near a substrate being coated.

Other objects and advantages of the present invention will become apparent from the following description and accompanying drawing. The invention is an electrostatic particle trap for use in ion beam sputter deposition, which enables the fabrication of extremely low defect density films or coatings. The invention involves a method and apparatus for interception and trapping of particulate matter generated in ion beam sputter deposition. The invention involves positioning an electrostatic trap composed of an array of electrodes (1 through n) adjacent a substrate to be coated, generating an electrostatic field in the vicinity of the substrate, and configuring the fields to force the undesired particulate material away from the substrate. The invention enables the production of low defect ion beam sputter deposited multilayers, such as Mo/Si multilayer coatings, for extreme ultraviolet lithography masks, or for other applications requiring low defect density films or coatings.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The invention is directed to the fabrication of low defect films and coatings by ion beam sputter deposition. The invention is particularly applicable for the production of low defect ion beam sputter deposited multilayers, such as MoSi, for extreme ultraviolet (EUV) lithography masks, or for other ion beam processing applications requiring low defect density films. Broadly, the invention involves an electrostatic particle trap for use in ion beam sputter deposition. More specifically, the invention involves a method and apparatus for the interception and trapping of particulate matter generated in ion beam sputter deposition. The apparatus involves an array of electrodes (1 through n) positioned adjacent to a substrate to be coated by ion beam sputter deposition, with the electrodes connected electrically to produce an electrostatic field therebetween. The method involves the interception and trapping of charged particles achieved by the generated electrostatic field in the vicinity of the substrate, and configuring the fields to force the particulate material away from the substrate. This provides for active control of the spatial distribution of particulate material within an ion beam sputter deposition system and the fabrication of extremely low defect density films or multilayer coatings.

The invention consists of an array of electrode surfaces (1 through n), each maintained at an electrostatic potential $V_n$. The electrodes and potentials are selected to produce electrostatic fields that provide sufficient force to prevent a particle with a charge q from depositing on the substrate surface. An embodiment of an array of electrode surfaces is illustrated in the FIG. 1.

Figure 1:
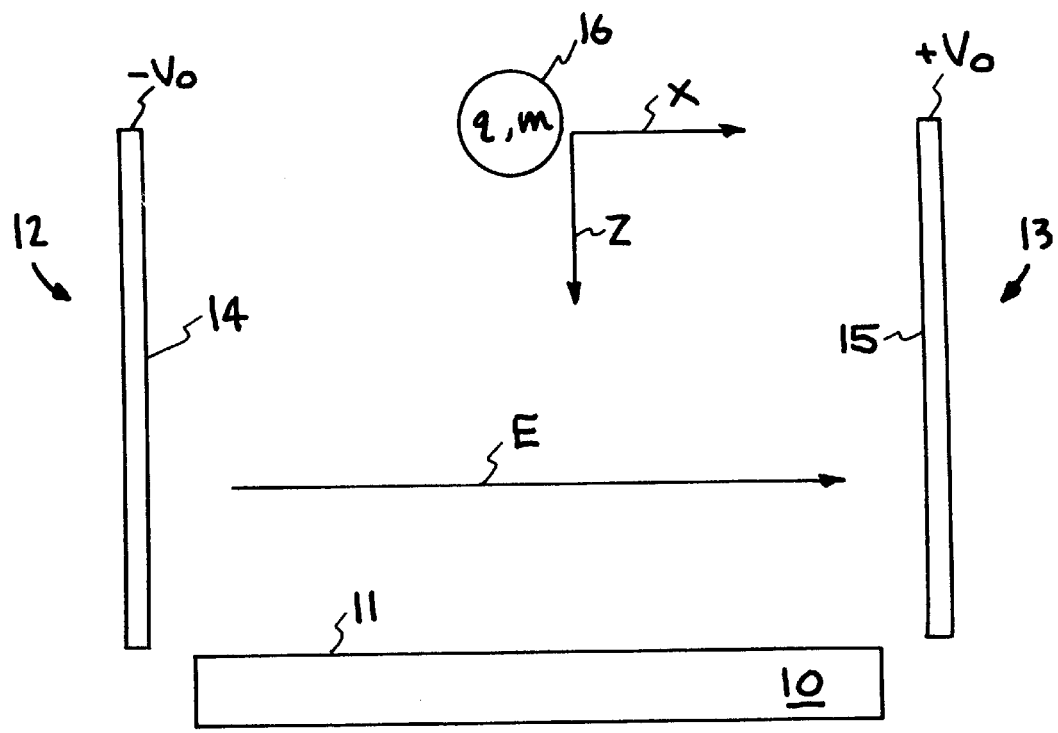
FIG. 1 schematically illustrates an embodiment of the apparatus and the method of trapping charged particles in accordance with the invention.

FIG. 1, a two electrode transverse-field bipolar arrangement is shown. The substrate 10 having a surface 11 is oriented with its normal in the −z direction. Two electrodes 12 and 13 are located immediately above the substrate 10, with their surfaces 14 and 15 oriented perpendicular to the surface 11 of substrate 10 and maintained at equal and opposite potentials ± $V_0$, producing an electric field E in the x direction (parallel to the substrate surface). A particle 16 of charge q and mass m entering the field containing region experiences a force Fx.

$$Fx = qE = m\frac{d^2x}{dt^2}$$

in the x direction. Positively charged particles are accelerated in the −x direction, negatively charged particles are accelerated in the +x direction. Thus charged particles are swept away from the substrate and prevented from reaching the substrate surface. A variety of embodiments of the invention employing single and multiple electrodes are possible. The bipolar design of the FIG. 1 is a straightforward example of the invention.

Figure 2:
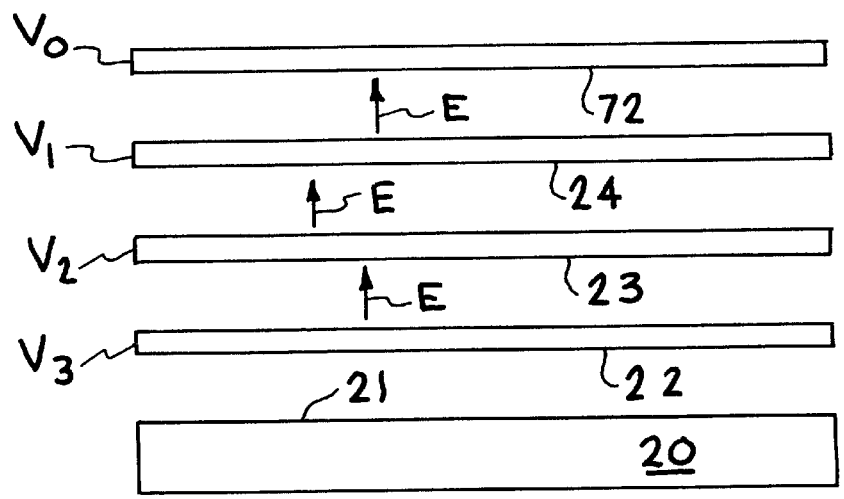
FIG. 2 schematically illustrates another embodiment of the apparatus.

FIG. 2 illustrates another embodiment using multiple electrode surfaces (1 through n), each electrode is maintained at an electrostatic potential $V_n$, producing electrostatic fields therebetween. As shown, substrate 20 has a surface 21 to be coated. With adjacent electrodes 22, 23, 24 and n maintained at potentials as illustrated at $V_3$, $V_2$, $V_1$, and $V_0$ arranged such that charged particles are accelerated away from the surface 21 of substrate 20.

Both of the embodiments of FIGS. 1 and 2 require at least one electrode, preferably two for the transverse field configuration shown in FIG. 1, but each embodiment can use multiple electrodes as shown in FIG. 2.

The illustrated apparatus is designed specifically to reduce the defect density of ion beam sputter deposited multilayer coating for extreme ultraviolet lithography mask applications, wherein zero defects are the goal. However, the invention can be applied wherever charged particles contribute to coating defects in ion beam processing.

While particular embodiments of the method and apparatus of the present invention exemplify and teach the principles of the invention, such are not intended to be limiting. Modifications and changes may become apparent to those skilled in the art, and it is intended that the invention be limited only by the scope of the appended claims.

What is claimed is:

1. In an ion beam sputter deposition system, the improvement comprising:
   an electrostatic particle trap positioned adjacent a substrate to be coated for interception and trapping of charged particulate matter generated in ion beam sputter deposition.

2. The improvement of claim 1, wherein said electrostatic particle trap includes at least one electrode having a potential applied thereto that attracts charged particles generated during ion beam sputter deposition.

3. The improvement of claim 1, wherein said electrostatic particle trap includes at least one pair of electrodes positioned adjacent a surface of a substrate to be coated.

4. The improvement of claim 3, wherein electrical potential applied to said at least one pair of electrodes is equal but opposite in polarity.

5. The improvement of claim 1, wherein said electrostatic particle trap includes 1 to n electrodes.

6. A method for fabricating low defect density multilayer films or coating by ion beam sputter deposition including providing an apparatus for the interception and trapping or reflection of particulate matter generated in ion beam sputter deposition.

7. The method of claim 6, wherein providing the apparatus is carried out by providing at least one electrode for generating an electrostatic field in the vicinity of a substrate being coated.

8. The method of claim 6, wherein providing the apparatus is carried out by providing an electrode array having 1 to n electrodes positioned to produce an electrostatic field adjacent a substrate to be coated for attracting particulate matter away from the substrate.

9. The method of claim 8, wherein providing the apparatus is carried out by positioning at least two electrodes adjacent a substrate to be coated, positioning electrode surfaces to be perpendicular to a surface of the substrate, and applying an equal but opposite potential to the at least two electrodes.

10. The method of claim 9, wherein the potential is applied to the electrodes such that a particle of a charge q and a mass m entering an electrostatic field E in a direction x produced by the electrodes experiences a force $$Fx = qE = m\frac{d^2x}{dt^2}.$$

11. The method of claim 6, wherein providing the apparatus is carried out by providing a two electrode, transverse-field bipolar arrangement, orienting a substrate to be coated with its surface normal in a first direction, placing the electrodes in spaced relation adjacent the substrate with surfaces thereof oriented parallel to the substrate surface, and maintaining equal and opposite potential on the electrodes for producing an electric field in a second direction perpendicular to the substrate surface.

12. In a method for the fabrication of low defect density films produced by ion beam sputter deposition, the improvement comprising:
   providing means for the interception and trapping of charged particulate matter generated during ion beam sputter deposition.

13. The improvement of claim 12, wherein the interception and trapping of the charged particulate matter is carried out by generating electrostatic fields in the vicinity of a substrate being coated, and configuring the fields to force the charged particulate matter away from the substrate.

14. The improvement of claim 13, wherein the low defect density film deposited is composed of an Mo/Si multilayer coating for extreme ultraviolet lithography masks.

15. The improvement of claim 13, wherein generating the electrostatic fields is carried out by positioning at least one pair of electrodes having surfaces perpendicular to the surface being coated, and applying an equal but opposite potential on the at least one pair of electrodes.

16. The improvement of claim 13, wherein generating the electrostatic fields are carried out by positioning at least one pair of electrodes having surfaces parallel to the surface being coated, and applying potentials on at least one pair of electrodes.

17. The improvement of claim 13, wherein the electrostatic fields are produced by a plurality of electrodes.

18. A method for fabricating low defect density multilayer films or coatings by ion beam sputter deposition comprising:
   intercepting particulate matter generated by the ion beam, and
   trapping or reflecting the particulate matter.

19. The method of claim 18, wherein the intercepting and trapping or reflection of particulate matter is carried out by providing at least one electrode for generating an electrostatic field in a vicinity of a substrate being coated.

20. The method of claim 18, wherein the intercepting and trapping or reflection is carried out by providing an electrode array having 1 to η electrodes positioned to produce an electrostatic field adjacent a substrate to be coated for attracting particulate matter away from the substrate.

21. The method of claim 18, wherein the intercepting and trapping or reflection is carried out by positioning two electrodes adjacent the substrate to be coated, positioning electrode surfaces to be perpendicular to a surface of the substrate, and applying an equal but opposite potential to the two electrodes.

22. The method of claim 21, additionally including applying the potential to the electrodes such that a particle of a charge q and a mass m entering an electrostatic field E in a direction $\chi$ produced by the electrodes experiences a force $$Fx = qE = m\frac{d^2x}{dt^2}.$$

23. The method of claim 18, wherein the intercepting and trapping or reflection is carried out by providing a two electrode, transverse-field bipolar arrangement, orienting a substrate to be coated with its surface normal in a first direction, placing the electrodes in spaced relation adjacent the substrate with surfaces thereof oriented parallel to the substrate surface, and maintaining equal and opposite potential on the electrodes for producing an electric field in a second direction perpendicular to the substrate surface.

* * * * *